US009714958B2

(12) United States Patent
Caous

(10) Patent No.: US 9,714,958 B2
(45) Date of Patent: Jul. 25, 2017

(54) DETECTOR FOR A CONDUCTOR OF AN ELECTRICAL NETWORK

(71) Applicant: Schneider Electric Industries SAS, Rueil-Malmaison (FR)

(72) Inventor: Philippe Caous, Villemoirieu (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 14/989,292

(22) Filed: Jan. 6, 2016

(65) Prior Publication Data

US 2016/0209447 A1    Jul. 21, 2016

(30) Foreign Application Priority Data

Jan. 20, 2015   (FR) ..................................... 15 50427

(51) Int. Cl.
*G01R 15/18*  (2006.01)
*G01R 1/04*   (2006.01)
(Continued)

(52) U.S. Cl.
CPC ......... *G01R 15/186* (2013.01); *G01R 1/0408* (2013.01); *H01F 27/2823* (2013.01); *G01R 15/142* (2013.01)

(58) Field of Classification Search
CPC .. G01R 15/186; G01R 15/165; G01R 15/142; G01R 19/0092; G01R 1/22;
(Continued)

(56) References Cited

U.S. PATENT DOCUMENTS 4,806,855 A * 2/1989 Davis ..................... G01R 15/14
324/127
5,729,125 A * 3/1998 Schweitzer, Jr. ........ G01R 1/22
324/127
(Continued)

OTHER PUBLICATIONS

French Preliminary Search Report (with Written Opinion ) issued Nov. 11, 2015 in French Application 15 50427 filed on Jan. 20, 2015 (with English Translation of Categories of Cited Documents).

*Primary Examiner* — Son Le
*Assistant Examiner* — Dustin Dickinson
(74) *Attorney, Agent, or Firm* — Oblon, McClelland, Maier & Neustadt, L.L.P.

(57) ABSTRACT

A detector for an electrical conductor includes a frame on which is mounted a mechanism including a magnetic toroid, divided into a first and a second branches and at least two jaws for anchoring the detector on the electrical conductor, each jaw being rotationally mobile between an open position and a locked position. The first branch of the toroid is secured to the frame and its second branch is rotationally mobile relative to the first branch, under the action of an elastic return member, between an open position, a preclosure position and a closed position of the magnetic toroid. The mechanism also includes a bearing member, secured to the second branch and defining at least one concave volume for partially receiving the electrical conductor. The bearing member is suitable for transmitting to the second branch a torque of pre-closure to a pre-closure position.

8 Claims, 7 Drawing Sheets

(51) Int. Cl.
*H01F 27/28* (2006.01)
*G01R 15/14* (2006.01)

(58) Field of Classification Search
CPC ............... G01R 1/0408; G01R 27/2823;
G01R 31/021; H01R 43/26; H01F 27/2823
See application file for complete search history.

(56) References Cited

U.S. PATENT DOCUMENTS

| | | |
|---|---|---|
| 2008/0088299 A1 | 4/2008 | Wolfe et al. |
| 2008/0129314 A1 | 6/2008 | Ricci et al. |
| 2008/0284410 A1 | 11/2008 | Perez |
| 2010/0084920 A1* | 4/2010 | Banting ............... G01R 15/142 307/66 |
| 2010/0085036 A1 | 4/2010 | Banting et al. |
| 2012/0146661 A1 | 6/2012 | Thomas |
| 2013/0187636 A1* | 7/2013 | Kast ................. G01R 21/00 324/127 |
| 2015/0340806 A1* | 11/2015 | Ilkhanov ............ H01R 13/6215 439/278 |

* cited by examiner

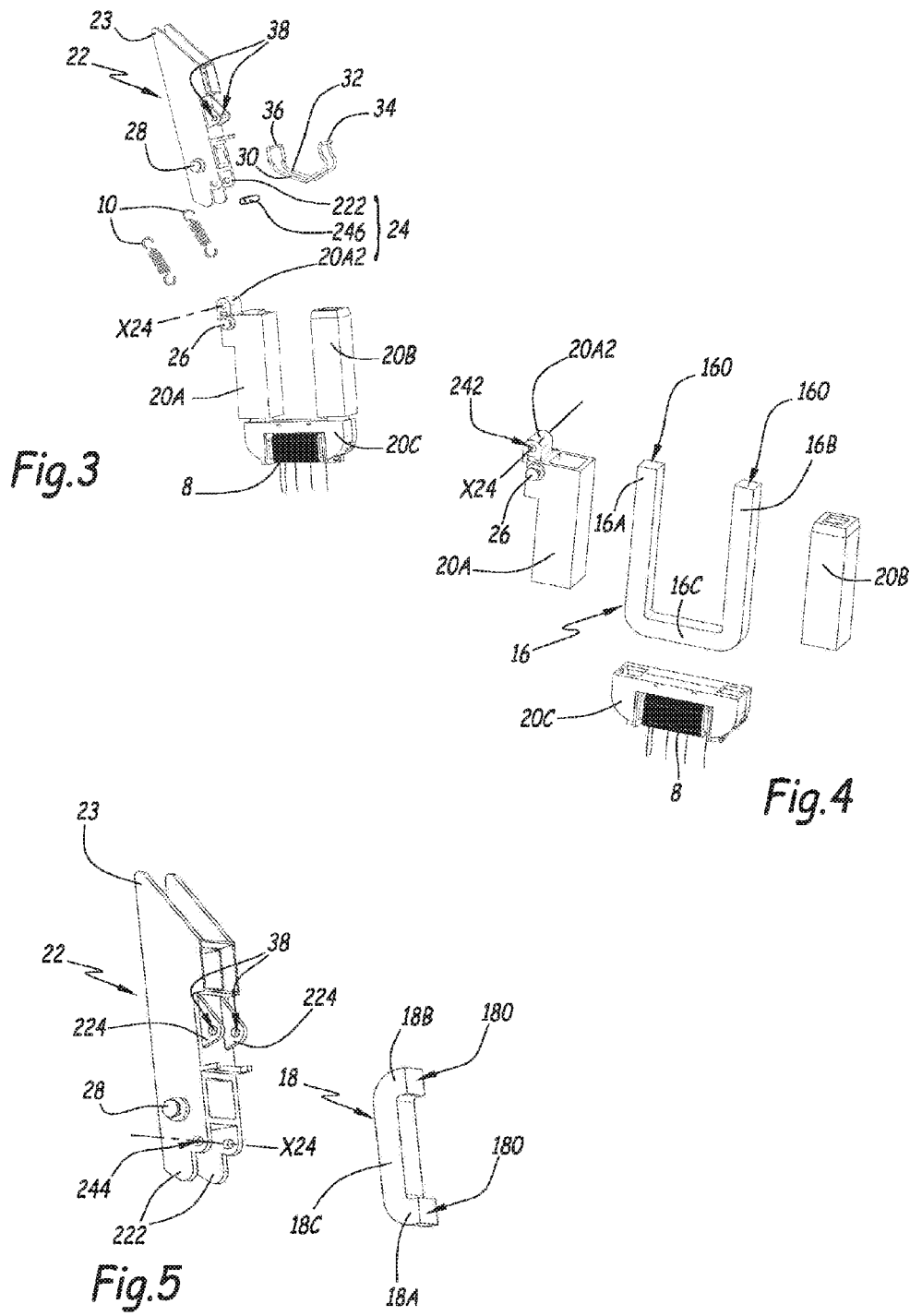

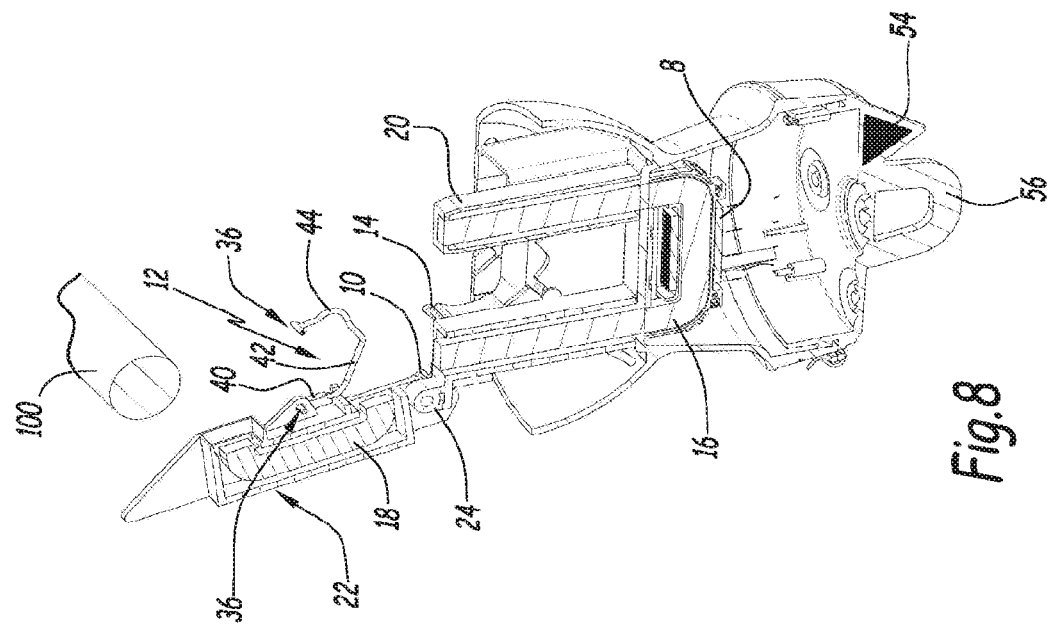
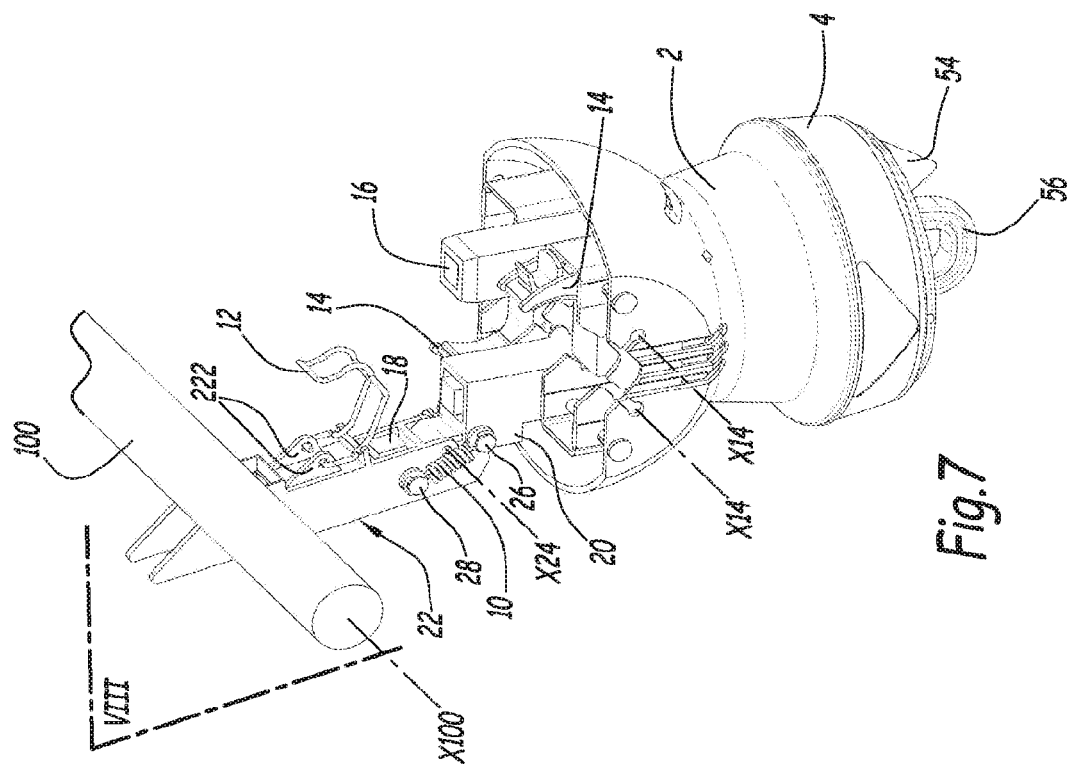

DETECTOR FOR A CONDUCTOR OF AN ELECTRICAL NETWORK

The present invention relates to a detector of at least one electrical quantity in an electrical conductor for a conductor of an electrical network.

In the field of overhead electrical distribution networks, it is known practice to use fault detectors installed on the transmission lines of an overhead distribution network. The detection of a fault is detected with a measurement of the current and an estimation of the phase difference between the current and the voltage transmitted by the line. For this, it is known practice from WO-A-2010/040265 to use a magnetic toroid closed around the conductor, in order to supply electrical energy to the electronic components.

The commissioning and maintenance of a detector can take place when the distribution network is operating. Consequently, these procedures concerning the detector are difficult and dangerous.

In this respect, it is known practice, for example from WO-A-2012/021478, to use a system of jaws to install the detector on the transmission line and a magnetic toroid to supply electrical energy to the electronic components of the detector. The jaws are closed around the conductor by virtue of a screw/nut system, which does not make it easy to install the detector. Indeed, the operator has to turn, with a boom, the screw of the screw/nut system, which is a long and tiring operation. It is therefore desirable to provide a fixing system for the conductor which makes it possible to easily install the detector and to easily close its magnetic toroid.

Such is the objective that the invention seeks more particularly to achieve, by proposing a novel detector for which the fitting is easy and the closure of the toroid is effective.

To this end, the invention relates to a detector of at least one electrical quantity in an electrical conductor, the detector comprising a frame, on which is mounted a mechanism including a magnetic toroid, divided into a first and a second branches, the toroid having a coil wound around one of its branches, and at least two jaws for anchoring the detector on the electrical conductor, each jaw being rotationally mobile, about an axis defined by the frame, between an open position and a locked position of the jaw. According to the invention, the first branch of the toroid is secured to the frame and its second branch is rotationally mobile, about an axis parallel to the axis of rotation of at least one jaw and defined by the frame, relative to the first branch, under the action of an elastic return member, between an open position, a pre-closure position and a closed position of the magnetic toroid. The mechanism also comprises a bearing member, secured to the second branch of the magnetic toroid and defining at least one concave volume for partially receiving the electrical conductor, the bearing member being suitable for transmitting to the second branch of the magnetic toroid a torque of pre-closure of the magnetic toroid to a pre-closure position in which the electrical conductor is in place in the bearing member and the bearing member is suspended from the second branch. Furthermore, the jaws are configured to apply a clamping force to the electrical conductor, when it is in place in the bearing member. Finally, the bearing member is suitable for transmitting, to the second branch, the clamping force exerted by the jaws on the electrical conductor, and for displacing this branch from the pre-closure position to the closed position.

By virtue of the invention, the electrical conductor provokes the actual closure of the magnetic toroid, by driving the bearing member, and the locking of the jaws. This substantially reduces the electrical dissipations in the toroid, which allows for the use of toroids of smaller section. Furthermore, the operators simply have to hoist the detector using a boom which is easier and quicker than maneuvering a screw system.

According to advantageous but non-mandatory aspects of the invention, such a detector can incorporate one or more of the following features, taken in any technically acceptable combination:

The bearing member delimits a first volume for partially receiving the electrical conductor when the bearing member transmits to the second branch the pre-closure torque and a second volume for partially receiving the electrical conductor when the bearing member transmits to the second branch the clamping force of the jaws.

The first and second branches are arranged respectively in first and second casings and the bearing member is mounted on the second casing.

A part of the first branch of the magnetic toroid extends beyond the first casing and at least a part of the second branch of the magnetic toroid is recessed in the second casing.

The second casing is provided with a portion for guiding the electrical conductor to the bearing member.

The bearing member comprises a first portion for securing to the second casing, a second and a third portions for bearing the electrical conductor.

The bearing member is made of a nonmagnetic material.

The bearing member consists of a bent wire defining two parallel sections.

The first and second branches of the magnetic toroid are of rectangular or circular form.

The detector further comprises a base secured to the frame and including a communication unit and an anchoring ring.

The invention will be better understood and other benefits thereof will become more apparent in light of the following description of an embodiment of a detector according to its principle, given by way of example and illustrated in the attached drawings in which:

FIG. 3 is an exploded perspective view of a magnetic toroid of the detector of FIG. 1;

FIG. 4 is an exploded perspective view of a first branch of the magnetic toroid in FIG. 3;

FIG. 5 is an exploded perspective view of a second branch of the magnetic toroid in FIG. 3;

FIG. 7 is a view similar to FIG. 1, when the detector approaches an electrical conductor;

FIG. 8 is a cross-section, along the plane VIII in FIG. 7, of the detector and of the electrical conductor in FIG. 7;

Figure 1:
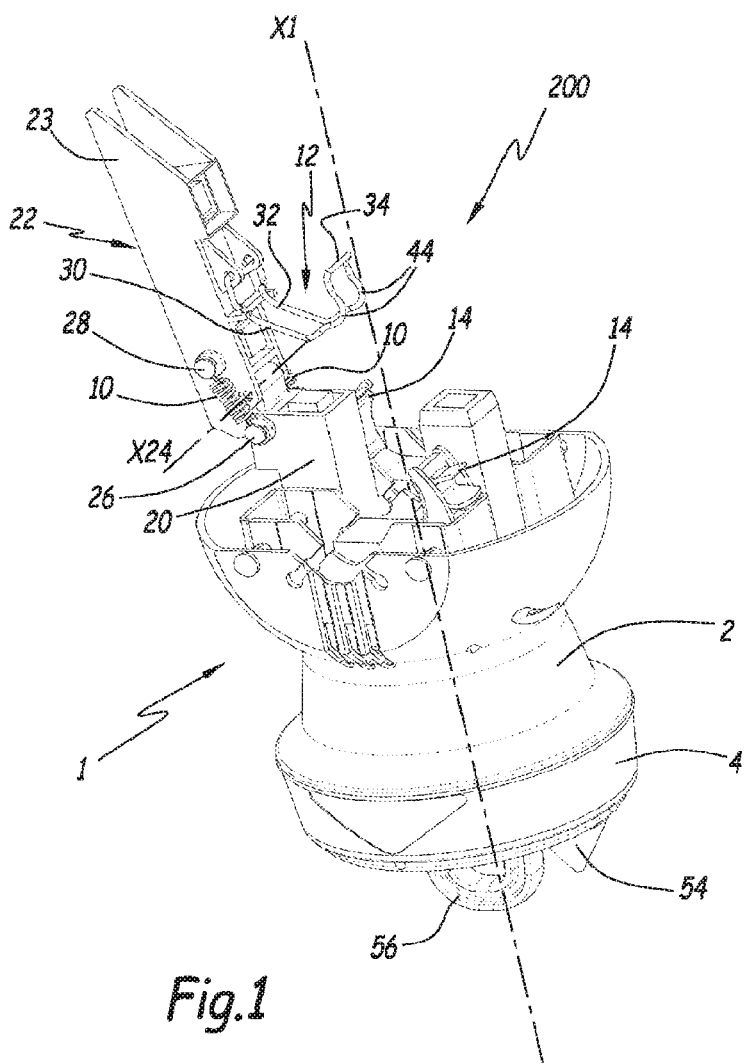
FIG. 1 is a perspective view of a detector according to the invention, when it is in an open position.

As is known per se, an overhead medium-voltage network, which is not represented in the figures, comprises at least three transmission lines, each line consisting of an electrical conductor 100. Each transmission line is equipped with a detector 1 of at least one parameter of an alternating current flowing in the electrical conductor 100. The detector is configured to transmit signals to a hub which is adapted to analyse the data sent and transmit the results to a control centre through a wired connection line or via long-range radio signals. The hub can also transmit control radio signals, to the detectors 1. In another embodiment of the invention, the functions of the hub are implemented by one or each detector.

As a variant, the detector is configured to transmit light signals that can be seen on the ground by an operator.

The detector 1, represented in FIGS. 1 to 13, is a device for detecting at least one parameter of an alternating current in the electrical conductor 100. These parameters can be the phase, the current or the voltage flowing in the conductors 100 of the transmission line.

The detector 1 comprises a frame 2 and a base 4. The frame 2 is configured to be screwed onto the base 4.

X100 denotes an axis of the electrical conductor 100 parallel to the transmission line. X1 also denotes a central axis of the detector 1. The axes X1 and X100 are at right angles when the detector 1 is suspended from the conductor 100.

The frame 2 supports a mechanism 200 configured, on the one hand, to allow for the detection of the current in the electrical conductor 100 and, on the other hand, to moor the detector 1 around this electrical conductor.

The mechanism 200 includes a magnetic toroid 6, a coil 8, two elastic return members 10, a bearing member 12 and two jaws 14.

The magnetic toroid 6 is divided into a first branch 16 and a second branch 18. The branches 16 and 18 are of globally rectangular form.

As a variant not represented in the figures, the branches 16 and 18 are of rounded form, for example circular.

As is known per se, the magnetic toroid 6, when it surrounds the electrical conductor 100, is suitable for inducing an electrical current in the coil 8, said induced current being a function of the alternating current flowing in the conductor 100. This current flowing in the conductor 100 can thus be measured and/or used to supply electrical energy to one or more devices.

The first branch 16 is provided with two rectilinear bars 16A and 16B, each defining an exposed face 160, and a central bridge 16C which links the bars 16A and 16B together. The coil 8 is wound around the first branch 16 of the magnetic toroid 6, in practice around the central bridge 16C. Similarly, the second branch 18 is provided with two ends 18A and 18B, each defining an exposed face 180, and a central bridge 18C which links the ends 18A and 18B together. The ends 18A and 18B are of the same length and shorter than the bars 16A and 16B, which are also of the same length.

As a variant not represented in the figures, the ends 18A and 18B have the same length as the bars 16A and 16B.

The branches 16 and 18 are arranged respectively in a first casing 20 and a second casing 22. In particular, the first casing 20 consists of three separate portions: a portion 20A in which the bar 16A is arranged, a portion 20B in which the bar 16B is arranged and a portion 20C in which the central bridge 16C is arranged. The bar 16A of the first branch 16 extends beyond the first casing 20, whereas the exposed face 160 of the bar 16B is aligned with the casing 20. With respect to the second branch 18, the face 180 of the end 18A is aligned with the second casing 22, whereas the end 18B is recessed in the casing 22. Such a construction of the branches and of the casings ensures, when the toroid 6 is in its closed position, the seal-tightness of the toroid 6 from the outside, the casings 20 and 22 having a protection and insulation function for the branches 16 and 18.

The second casing 22 is provided with a portion 23 for guiding the conductor 100.

As a variant not represented in the figures, the first casing 20 is also provided with a portion for guiding the electrical conductor 100, on the side of its portion 20B.

24 is used to denote a hinge defined between the casings 20 and 22 in the vicinity of the exposed faces 160 and 180 of the branches. The hinge 24 is formed by an extension 20A2 of the casing 20A which is engaged between two lugs 222 of the casing 22 by aligning the orifices 242 and 244 respectively formed on the parts 20A2 and 222 and by inserting a shaft 246 therein. X24 also denotes the axis of the hinge 24 defined by the shaft 246 and which is parallel, when the detector 1 is installed, to the axis X100 of the electrical conductor 100.

The first branch 16 is secured, with its casing 20, to the frame 2. The second branch 18 is rotationally mobile, about the axis X24, relative to the first branch 16 between an open position, a pre-closure position and a closed position of the magnetic toroid 6. The second branch 18 is rotationally mobile about the axis X24, relative to the first branch 16, under the action of the elastic return members 10. The elastic return members 10 are, in the example, spiral springs.

When the toroid 6 is in its open configuration, the branch 18 is in its open position, that is to say separated from the branch 16, as shown in FIG. 7.

Figure 10:
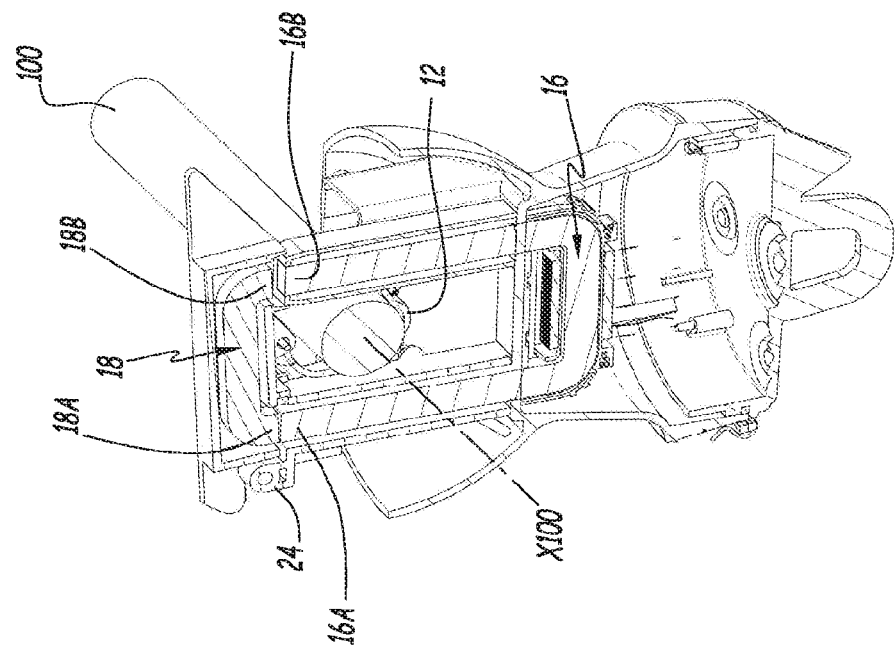
FIG. 10 is a view similar to FIG. 7, when the detector is in a pre-closure position.
Figure 11:
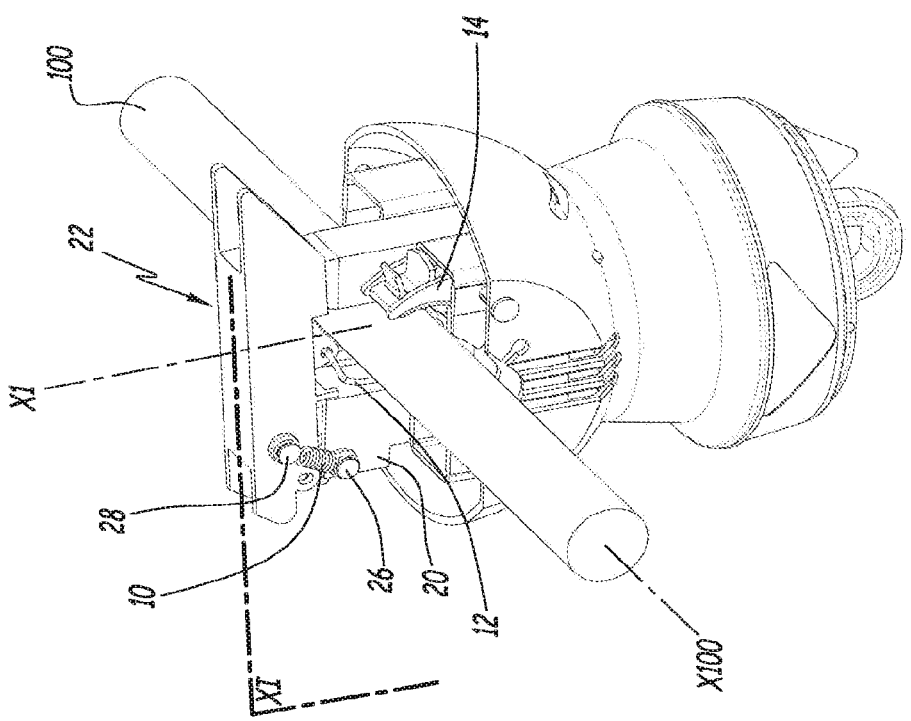
FIG. 11 is a cross-section, along the plane XI in FIG. 10, of the detector and of the electrical conductor in FIG. 10.
Figure 13:
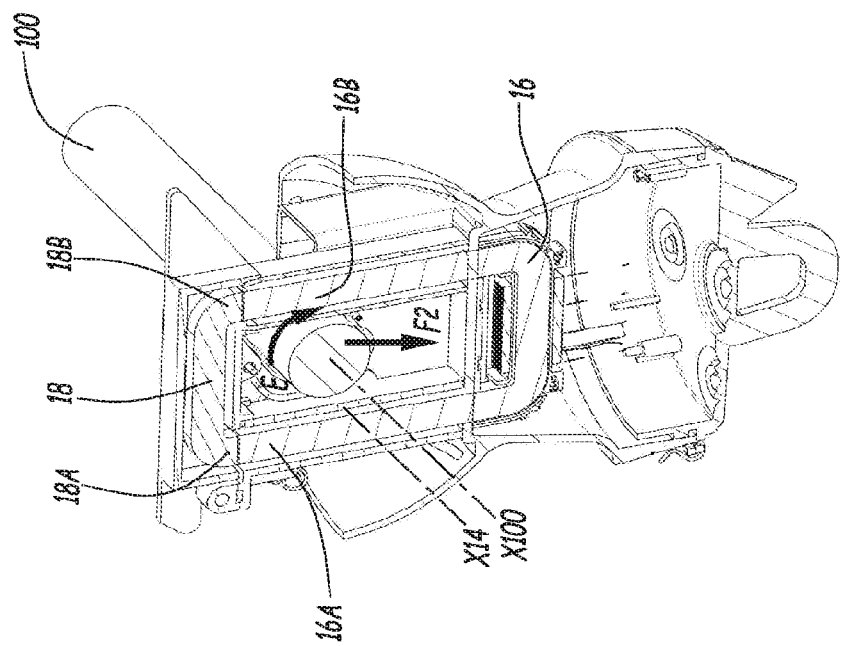
FIG. 13 is a cross-section, along the plane XIII in FIG. 12, of the detector and of the electrical conductor in FIG. 12.
Figure 12:
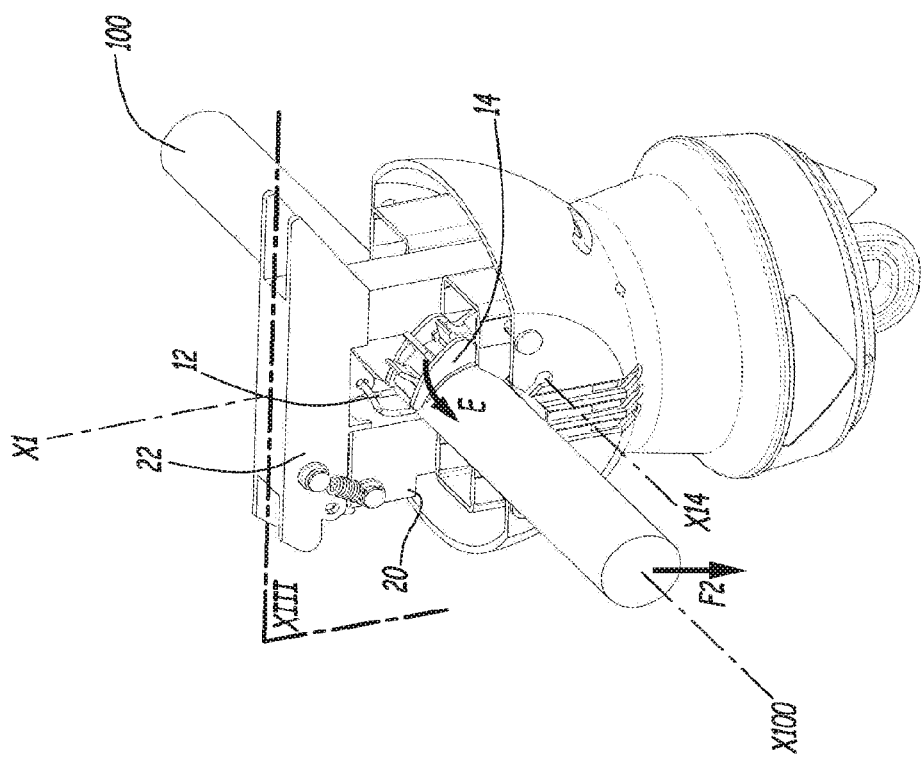
FIG. 12 is a view similar to FIG. 7 when the detector is in a closed position.

When the toroid 6 is in its pre-closure configuration, the branch 18 is close to the branch 16, as shown in FIGS. 10 and 11. The exposed faces 160 and 180 are facing one another but are not in contact.

When the toroid 6 is in its closed configuration, the branch 18 is in its closed position and the exposed faces 160 and 180 are bearing against one another. The branches 16 and 18 are closed on one another and form the closed magnetic circuit of the toroid 6.

26 denotes two fingers of the first casing 20, only one of which can be seen in the figures. The fingers 26 are arranged, parallel to the axis X24, on either side of the casing 20. 28 also denotes two fingers of the second casing 22, only one of which can be seen in the figures. The fingers 28 are arranged, parallel to the axis X24, on either side of the casing 22.

Each spring 10 is hooked, on the one hand, onto a finger 26 of the casing 20 and, on the other hand, onto a finger 28 of the casing 22. Therefore, each spring 10 is stretched between two fingers 26 and 28.

Given the relative position of the fingers 26 and 28 and of the axis X24, the displacement of the branch 18 and of the casing 22 is bistable between the open and pre-closure positions of the branch 18. In other words, when only the elastic force due to the springs 10 is exerted on the casing 22, the branch 18 is either in its open position, or in its pre-closure position, and this elastic force must be overcome to switch from one position to the other.

When a sufficiently great torque moves the parts 18 and 22 from one of their stable positions, these parts switch over beyond a median position and the springs 10 exert a force which makes them reach the other stable position. In other words, the springs 10 are configured to pull the parts 18 and 22 from the open position to the pre-closure position of the magnetic toroid 6, when these parts have gone beyond the median position. The springs 10 are also configured to pull the casing 22 and the branch 16 from the pre-closure position to the open position of the toroid 6, when these parts have gone beyond the median position in the other direction.

The bearing member 12 is secured to the second branch 18 of the magnetic toroid 6. In particular, the bearing member 12 is articulated on two lugs 224 of the second casing 22. The bearing member 12 is, in the example, a hook. The bearing member 12 is, preferably, made of a nonmagnetic material in order to not disrupt the magnetic circuit of the magnetic toroid 6.

The bearing member 12 is produced by a metal wire bent back on itself to define two parallel sections 30 and 32. The sections 30 and 32 are linked by a portion 34 at right angles to the sections and each have a free end 36 arranged in a bore 38 of a lug 224 of the second casing 22.

Figure 2:
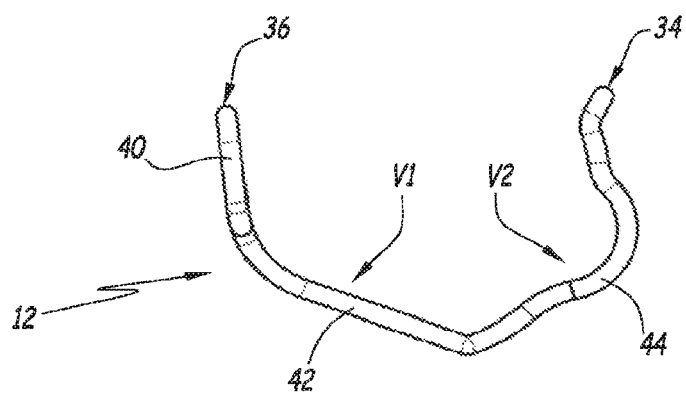
FIG. 2 is a side view of a bearing member belonging to the detector of FIG. 1.
Figure 6:
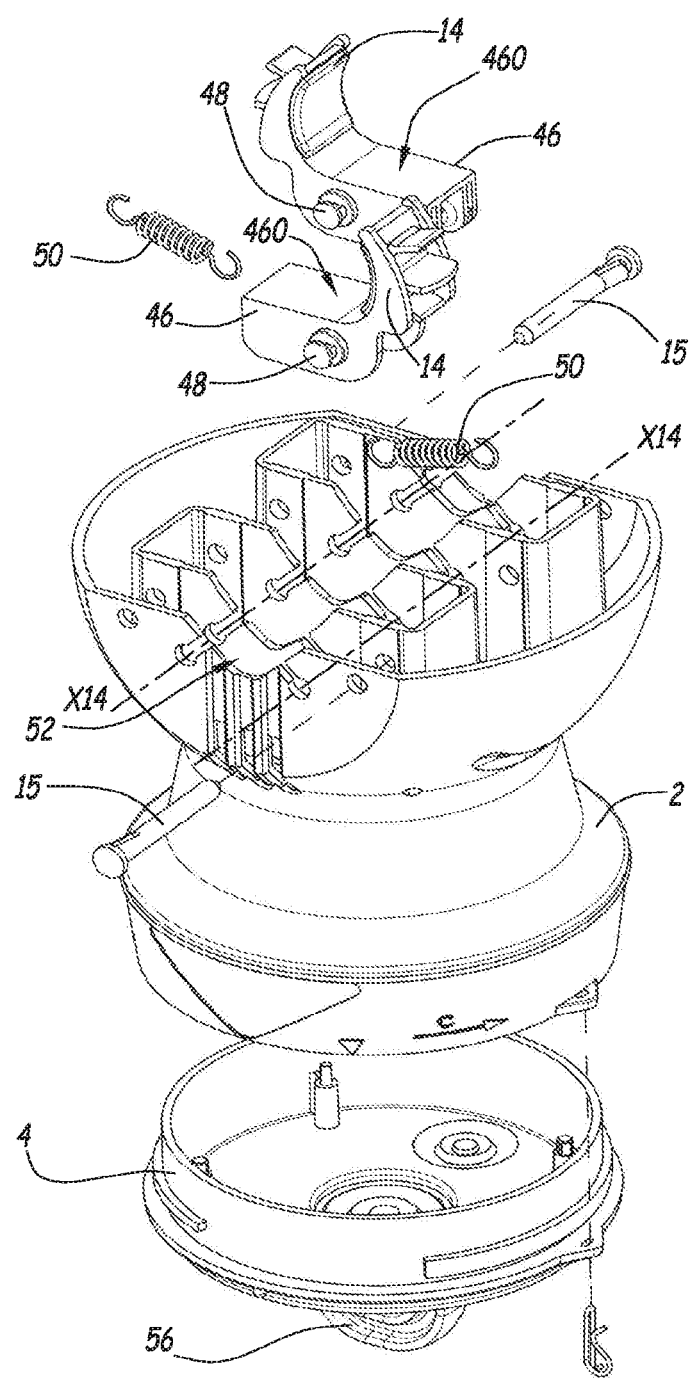
FIG. 6 is an exploded perspective view of a base, a frame and a jaws of the detector in FIG. 1.

As can be seen in FIG. 2, each section 30 or 32 of the bearing member 12 comprises a first portion 40, a second portion 42 and a third portion 44.

The portion 40 comprises the free end 36 which is configured to secure the bearing member 12 to the casing 22. According to the drawing of FIG. 2, the portion 40 has a rectilinear profile. According to the same drawing, the second portion 42 also has a rectilinear profile and is bent, relative to the portions 40 and 44, so as to form two obtuse angles. The third portion 44 has an arched profile. By means of the portions 40, 42 and 44, the bearing member 12 defines a first concave volume V1 and a second concave volume V2 for partially receiving the electrical conductor 100.

The bearing member 12 is configured to receive the electrical conductor 100. In particular, the conductor 100 comes to bear on the portions 42 and 44. The bearing member 12 is suitable for transmitting to the second casing 22, and thus to the second branch 18, a torque C of pre-closure of the magnetic toroid 6 when the electrical conductor 100 is received in the volume V1 of the member 12. The pre-closure torque C displaces the branch 18 from the open position to the pre-closure position in which the electrical conductor 100 is in place in the bearing member 12 and the bearing member 12 is suspended from the second branch 18.

The volume V2 is suitable for receiving the conductor 100 when the toroid 6 is in its pre-closure position. The arched profile of the portion 44 allows the member 12 to receive conductors of different diameters.

The jaws 14 form clamps for anchoring the detector 1 on the electrical conductor 100. They are arranged, according to the axis X24, on either side of the first branch 16 of the magnetic toroid 6. X14 denotes the two axes of rotation of the jaws 14 which are parallel to the axis X24.

Each anchoring jaw 14 is rotationally mobile about its axis X14 between an open position and a locked position of the jaw 14 on the conductor 100. Each jaw 14 is provided with a branch 46 which defines a planar surface 460 configured to bearingly receive the conductor 100. Furthermore, each jaw 14 is equipped with a finger 48 configured to hook a spring 50 thereon. The springs 50 are hooked on the other hand onto pins 15 mounted on the frame 2. When the electrical conductor 100 is bearing on the surface 460 of a jaw 14, the tab 46 is rotated about the axis X14 which drives the rotation of the jaw 14, under the action of the spring 50, from the open position to the locked position. The jaws 14 are configured to then apply to the electrical conductor 100, when it is again in place in the bearing member 12, a clamping force E.

The frame 2 comprises a slot 52 in the form of a V along the axis X1 of the detector 1. The slot 52 is configured to house the electrical conductor 100 when it has rotated the jaws 14.

The base 4 of the detector 1 comprises an electronic measuring device, not represented, a communication unit 54 and an anchoring ring 56.

As a variant, the electronic measuring device is in the frame 2.

The electronic measuring device is configured to measure the electrical current generated by the coil 8. The electronic device is also supplied with electrical energy by the current from the coil 8.

The device comprises a processing unit, not represented, suitable for analysing the current measurement performed. The processing unit is configured to detect a defect of a parameter of the alternating current of the electrical conductor 100 and to send a command to the communication unit 54.

The communication unit 54 is, for example, a light communication unit, notably a diffuser, or a radio communication unit. In the case of a radio communication unit, this unit sends data concerning the fault or faults detected to a hub.

The fitting of the detector on a conductor 100 will now be described.

Before installation, the operator checks that the toroid 6 is in its open position and the jaws 14 are in their open position, as represented in FIG. 7. The second branch 18 is then separated from the first branch 16.

In order to install the detector 1 on the electrical conductor 100, an operator uses a boom anchored onto the anchoring ring 56. The operator hoists the detector 1 at right angles to the ground, along the axis X1.

Figure 9:
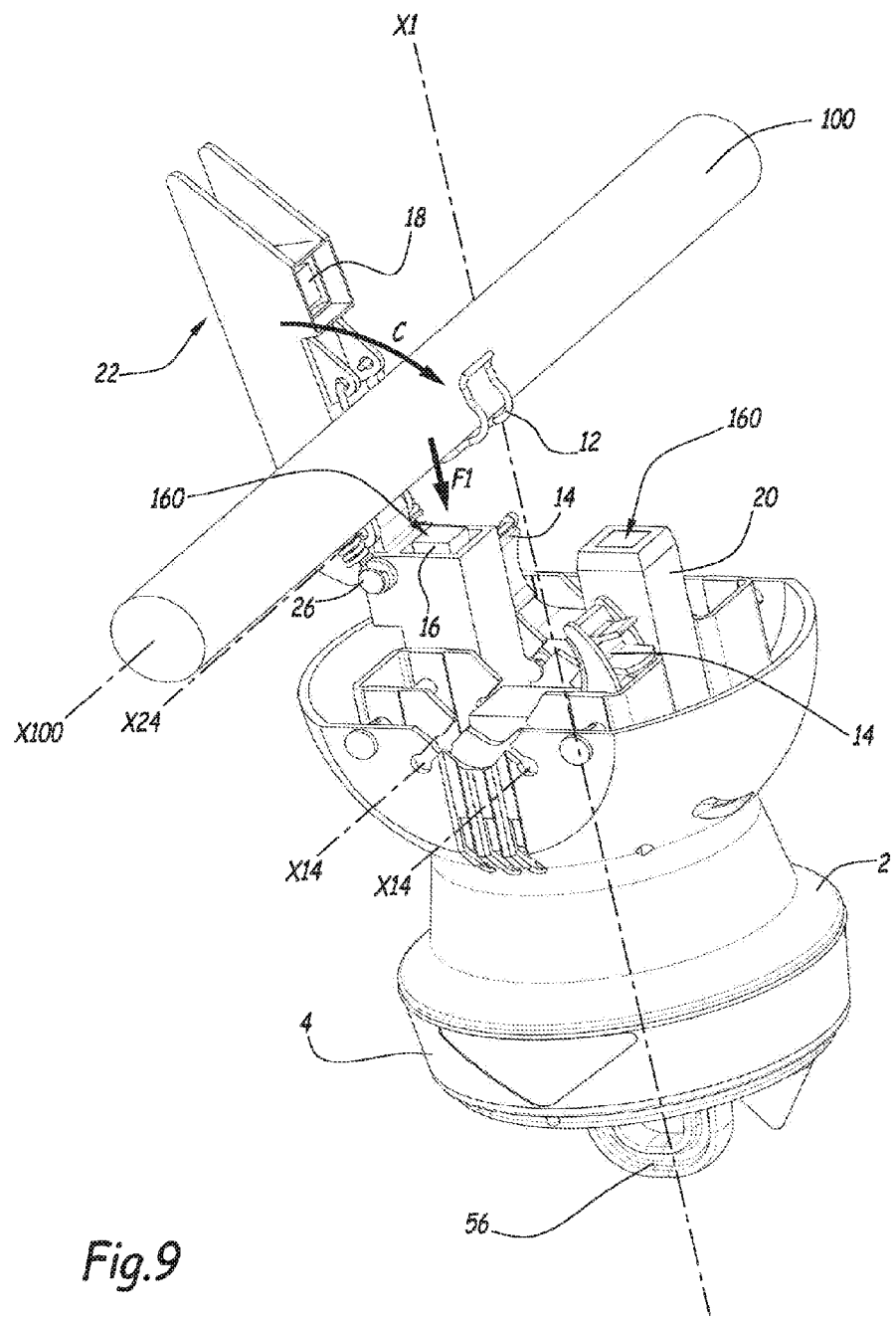
FIG. 9 is a view similar to FIG. 7, but on a larger scale, when the electrical conductor is bearing against the bearing member of the detector.

By optionally using the guiding portion 23 of the second casing 22, the operator displaces the detector 1 relative to the conductor 100 to bring the electrical conductor 100 into the bearing member 12, as represented in FIG. 9. The electrical conductor 100 is then partially received in the first volume V1 of the member 12. The operator continues to hoist, at right angles to the ground, the detector 1 and pushes the bearing member 12 against the conductor 100 with an increasing pressure. The electrical conductor 100 then exerts on the member 12 a force F1 that is globally parallel to the axis X1 and oriented downwards. This force F1 generates the so-called pre-closure torque C on the casing 22. The pre-closure torque C exerts around the axis X24 and in the direction of convergence of the branches 18 and 16, that is to say in the clockwise direction in FIG. 9. The bearing member 12 transmits the pre-closure torque C to the second branch 18 of the magnetic toroid 6.

The springs 10 initially exert a force resisting the pre-closure torque C. The operator hoisting the detector 1, the force F1 and, consequently, the torque C increase to overcome the resisting force of the springs 10. The parts 18 and 22 are then driven out of their stable open position, and, as described above, the springs 10 then exert a force to reach the other stable position, that is to say the pre-closure position.

In other words, the springs 10, which are added to the pre-closure torque C, rotate the second branch 18 and the second casing 22, about the axis X24, from the open position to the pre-closure position. This rotation is permitted via the hinge 24 which provides the join between the casings 20 and 22.

As represented in FIG. 10, the electrical conductor 100 is driven by the bearing member 12, between the bars 16A and 16B of the branch 16. In the pre-closure position, the conductor 100 is still in place in the member 12 and, in particular, is received in the second volume V2. The member 12 is still suspended from the casing 22. The casings 20 and 22 and the branches 16 and 18 are not completely closed. In particular, the surfaces 160 and 180 are facing one another. In this pre-closure position, the jaws 14 are in their open position.

From this pre-closure position, the operator continues to hoist the detector 1, until the conductor 100 bears against the surfaces 460 of the jaws 14. The electrical conductor 100 then exerts a force F2 against the surfaces 460. The force F2 is parallel to the axis X1 and oriented downwards. Under the force F2, the tabs 46, and therefore the jaws 14, are rotated about the axes X14. The jaws 14 then switch from their open position to their locked position on the conductor 100. The jaws 14 then apply the clamping force E to the electrical conductor 100.

This clamping force E is transmitted by the conductor 100 to the bearing member 12. The member 12 transmits the clamping force E to the casing 22. The second branch 18 and its casing 22 are rotated about the axis X24 and are displaced from the pre-closure position to the closed position. In this position, the magnetic toroid 6 is finally closed and its magnetic circuit is reconstituted. The surfaces 160 and 180 are bearing against one another. In other words, the branches 16 and 18 together form a closed magnetic circuit.

The embodiment and variants envisaged above can be combined to generate novel embodiments.

The invention claimed is:

1. A detector for detecting at least one electrical quantity in an electrical conductor, the detector comprising a frame on which a mechanism is mounted, the mechanism comprising:
   a magnetic toroid divided into a first branch and a second branch, the toroid having a coil wound around one of the first and second branches;
   at least two jaws configured to anchor the detector on the electrical conductor, each jaw being rotatable about an axis defined by the frame between an open position and a closed position of the jaw,
      wherein the first branch of the toroid is secured to the frame and the second branch is rotatable about an axis parallel to the axis of rotation of at least one jaw and defined by the frame, relative to the first branch, between an open position in which the second branch is spaced apart from the first branch, a pre-closure position in which the second branch is disposed closer to the first branch relative to the open position, and a closed position in which the first and second branches are closed on one another; and
   a bearing member including a bent wire defining two parallel sections each having a free end respectively disposed in each of two openings in the second branch, the bearing member being secured to the second branch of the magnetic toroid and defining at least one concave volume configured to partially receive the electrical conductor, the bearing member being configured to transmit to the second branch of the magnetic toroid a pre-closure torque to move the magnetic toroid to the pre-closure position, in which the electrical conductor is disposed in the bearing member and the bearing member is suspended from the second branch,
   wherein the jaws are configured to apply a clamping force to the electrical conductor, when the electrical conductor is disposed in the bearing member,
   wherein the first and second branches are respectively disposed in first and second casings, and the bearing member is mounted on the second casing, and
   wherein the bearing member is further configured to transmit, to the second branch, the clamping force exerted by the jaws on the electrical conductor and to move the second branch from the pre-closure position to the closed position.

2. The detector according to claim 1, wherein the bearing member delimits:
   a first volume configured to partially receive the electrical conductor when the bearing member transmits to the second branch the pre-closure torque and
   a second volume configured to partially receive the electrical conductor when the bearing member transmits to the second branch the clamping force of the jaws.

3. The detector according to claim 1,
   wherein at least a part of the first branch of the magnetic toroid extends beyond the first casing, and
   wherein at least a part of the second branch of the magnetic toroid is recessed in the second casing.

4. The detector according to claim 1, wherein the second casing includes a portion configured to guide the electrical conductor to the bearing member.

5. The detector according to claim 1, wherein the bearing member further comprises a first portion configured to be secured to the second casing, and second and a third portions configured to support the electrical conductor.

6. The detector according to claim 1, wherein the bearing member is made of a nonmagnetic material.

7. The detector according to claim 1, wherein the first and second branches of the magnetic toroid are of rectangular or circular form.

8. The detector according to claim 1, further comprising a base secured to the frame and including:
   a communication unit; and
   an anchoring ring.

* * * * *